United States Patent
Yu

[11] Patent Number: 5,705,841
[45] Date of Patent: Jan. 6, 1998

[54] ELECTROSTATIC DISCHARGE PROTECTION DEVICE FOR INTEGRATED CIRCUITS AND ITS METHOD FOR FABRICATION

[75] Inventor: Ta-Lee Yu, Hsien, Taiwan

[73] Assignee: Winbond Electronics Corporation, Hsinchu, Taiwan

[21] Appl. No.: 851,808

[22] Filed: May 6, 1997

Related U.S. Application Data

[63] Continuation of Ser. No. 577,297, Dec. 22, 1995, abandoned.

[51] Int. Cl.⁶ .................................................. H01L 23/62
[52] U.S. Cl. ..................................... 257/355; 257/356
[58] Field of Search ................................. 257/358, 360, 257/355, 356

[56] References Cited

U.S. PATENT DOCUMENTS

| | | | |
|---|---|---|---|
| 4,724,471 | 2/1988 | Leuschner | 257/360 |
| 4,893,157 | 1/1990 | Miyazawa et al. | 257/358 |
| 4,920,445 | 4/1990 | Jun | 257/356 |
| 5,293,057 | 3/1994 | Ho et al. | 257/356 |
| 5,455,436 | 10/1995 | Chong | 257/356 |
| 5,498,892 | 3/1996 | Walker et al. | |
| 5,521,413 | 5/1996 | Narita | 257/355 |

*Primary Examiner*—Stephen Meier
*Attorney, Agent, or Firm*—Fish & Richardson P.C.

[57] ABSTRACT

An electrostatic discharge (ESD) protection device includes a drain region and a source region, each having a heavily-doped region and a lightly-doped region, wherein the junction depth of the lightly-doped region is deeper than that of the heavily doped region. Accordingly, the ESD current density will be decreased owing to the enlarged junction area during the ESD event. In addition, the heat dissipation can be spread over the enlarged junction area instead of being focused on the cylindrical portion. Moreover, low parasitic capacitance in the bond pad is achieved because the junction capacitance of the lightly-doped region is smaller than that of the heavily-doped region. Furthermore, conducting blocks are arranged between the lightly-doped regions and the source/drain electrodes, respectively, to prevent the metal melt filament from spiking the junction.

16 Claims, 4 Drawing Sheets

ELECTROSTATIC DISCHARGE PROTECTION DEVICE FOR INTEGRATED CIRCUITS AND ITS METHOD FOR FABRICATION

This is a continuation of application Ser. No. 08/577,297, filed Dec. 22, 1995, now abandoned.

BACKGROUND OF THE INVENTION

1. Field of the Invention

The present invention generally relates to a protection device for integrated circuit (IC) technologies. More particularly, the present invention relates to an electrostatic discharge (ESD) protection device for use in integrated circuits and its method of fabrication.

2. Description of the Related Art

Electrostatic discharge, ESD hereafter, is a common phenomenon that occurs during handling of semiconductor IC devices. An electrostatic charge may accumulate for various reasons and cause potentially destructive effects on an IC device. Damage typically can occur during a testing phase of its fabrication, during assembly of the IC onto a circuit board, as well as during use of equipment into which the IC has been installed. Damage to a single IC due to poor ESD protection in an electronic device can hamper its designed functions partially, sometimes completely. ESD protection for semiconductor ICs is, therefore, a reliability issue.

ESD stress models are based on the reproduction of typical discharge pulses to which the IC may be exposed during manufacturing or handling. Three standard models, known as the Human Body Model (HBM), Machine Model (MM), and Charged Device Model (CDM) have been developed. The human-body model is set forth in U.S. Military Standard MIL-STD-883, Method 3015.6. This Military Standard models the electrostatic stress produced on an IC device when a human carrying an electrostatic charge touches the lead pins of the IC device. The machine model is set forth in Industry Standard EIAJ-IC-121, which describes the electrostatic stress produced on an IC device when a machine carrying an electrostatic charge contacts the lead pins of the IC device. The charged device model describes the ESD current pulse generated when an IC device already carrying an electrostatic charge is grounded in the process of its handling.

Referring to FIG. 1, an n-channel thick field-oxide transistor generally used as a protection device is depicted. In the drawing, blocks 5 and 6 represent a bond pad and an internal circuit to be protected, respectively. A line 7 connects the blocks 5 and 6. An n-channel thick field oxide transistor M1 as an ESD protection device is deposed between the bond pad 5 and ground, designated as GND, whereby the gate is tied to the drain and then connected to the line 7. The source is connected to the GND voltage.

Referring next to FIG. 2, the thick field-oxide transistor M1, in accordance with FIG. 1, conventionally formed on a semiconductor substrate is shown in cross-sectional view. The thick field oxide transistor includes: a semiconductor substrate 1, such as a p-type silicon substrate; field oxides 10, 11, 12 formed on a predetermined region of the substrate 1 by a process called local oxidation of silicon (LOCOS), wherein an active region 100 is defined between the field oxides 10 and 12; a drain region 13 and a source region 14, formed through ion implantation, are formed in the substrate 1 spaced apart by the field oxide 11; a dielectric layer 15 covers the protection device and is provided with two contact windows 16 and 17 to expose the drain region 13 and the source region 14, respectively; conducting layers 18,19, made from patterning the same aluminum layer, formed on the dielectric layer 15 thereto connect the exposed drain region 13 and the source region 14 via the contact windows 16 and 17, respectively. Furthermore, the conducting layer 18 strides over the field oxide 11 and connects to the bond pad 5. The conducting layer 19 is connected to ground.

In addition, FIG. 2 schematically depicts a parasitic npn bipolar junction transistor (BJT) with the drain region 13 as a collector, the substrate 1 as a base, and the source region 14 as an emitter. Symbol $R_B$ designates the base-spreading resistance. The protection device as depicted in FIG. 2 operates as a parasitic npn BJT during ESD event stresses. In conventional abrupt junction processes, when the drain junction is stressed commonly to the source region 14 and the substrate 1, the breakdown will occur at the cylindrical junction portion of the junction causing maximum heat generation at this location. The heat dissipated at the junction than leads to thermal breakdown and damage at the drain junction. Further heating results in a metal melt filament formation, with the heat spreading to the conducting layers 18 and 19, so as to spike the source/drain junctions, or even causing the source region 14 and drain region 13 to short-circuit. For the foregoing reasons, there is a need for an ESD protection device to lower the ESD current density as well as spread the heat over a larger area instead of focusing the heat on the cylindrical junction portion.

SUMMARY OF THE INVENTION

Accordingly, the present invention concerns an ESD protection device with enlarged source/drain junction area which provides an enhanced capability against ESD stress so as to decrease the ESD current. Furthermore, the present invention makes use of two conducting blocks arranged above the source region and drain region to prevent the metal melt filament from spiking the junction.

Moreover, the present invention pertains to a method for fabricating the above-mentioned ESD protection device with a junction area larger than a conventional one.

Accordingly, the present invention achieves the above objects by providing an electrostatic discharge protection device, which comprises:

a semiconductor substrate;

an isolating structure formed on the substrate;

a drain region and a source region formed in the substrate, each formed beneath and adjacent to opposite sides of the isolating structure, each of which is composed of a heavily-doped region and a lightly-doped region wherein the lightly-doped region has a junction depth greater than the heavily-doped region;

a dielectric layer covering the isolating structure, the source region, and the drain region, having a first contact window and a second contact window therethrough to expose the drain region and the source region, respectively;

a first electrode formed on the dielectric layer and coupled to the drain region via the first contact window; and a second electrode formed on the dielectric layer and coupled to the source region via the second contact window.

The present invention achieves the above object by providing a method for fabricating an electrostatic discharge protection device, which comprises the following steps:

(a) providing a semiconductor substrate;

(b) forming a field oxide layer on the substrate;

(c) forming a diffusion barrier on the substrate not covered by the field oxide layer;

(d) forming two openings through the diffusion barrier on opposite sides of the field oxide layer;

(e) forming a polysilicon layer on the barrier layer to contact the substrate via the openings, wherein the polysilicon layer is doped with impurities;

(f) diffusing the impurities into the substrate to form two lightly-doped regions under the openings, respectively;

(g) patterning the polysilicon layer to form two conducting blocks on the lightly-doped regions, respectively;

(h) implanting ions into the substrate not covered by the field oxide layer and the conducting blocks to form heavily-doped regions which have junction depths less than those of the lightly-doped regions;

(i) forming a dielectric layer overlying the overall surface of the device;

(j) forming two contact windows through the dielectric layer, each window exposing one of the conducting blocks; and (k) forming two electrodes, each electrode connected to one of the conducting blocks via a respective one of the contact windows.

BRIEF DESCRIPTION OF THE DRAWINGS

Other objects, features and advantages of the present invention will become apparent by way of the following detailed description of the preferred but non-limiting embodiment. The description is made with reference to the accompanying drawings, wherein.

DESCRIPTION OF THE PREFERRED EMBODIMENTS

Referring to FIGS. 3A–3E, the process flow of one preferred embodiment according to the present invention is depicted in cross-sectional views. These drawings merely show several key steps in sequential processes.

Figure 3A:
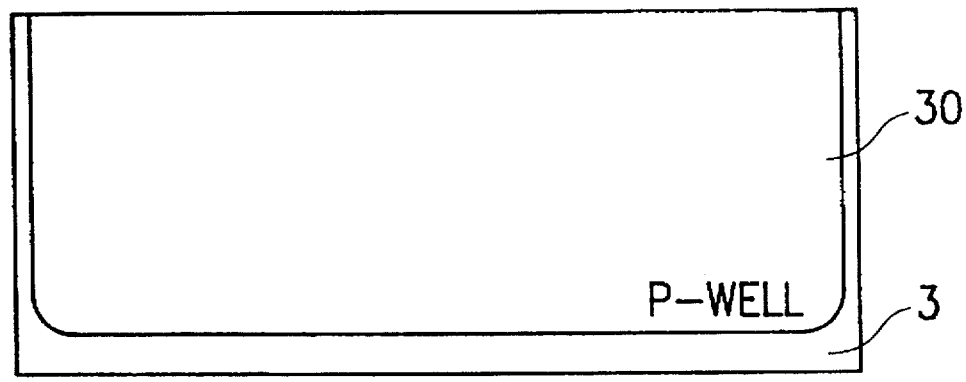
FIGS. 3A–3E depict the process flow of one preferred embodiment according to the present invention in cross-sectional views.

As first shown in FIG. 3A, a semiconductor substrate 3 is provided. The semiconductor substrate 3 might be either an n-type silicon substrate or a p-type silicon substrate. A well region 30 is then formed in the substrate 3 by means of ion implantation. If the fabricated ESD protection device is an n-channel device, the well region 30 is a p-well region as exemplified in the drawings. Also, the fabricated n-channel device might be directly fabricated in a p-type silicon substrate without the formation of the well region 30.

Figure 3B:
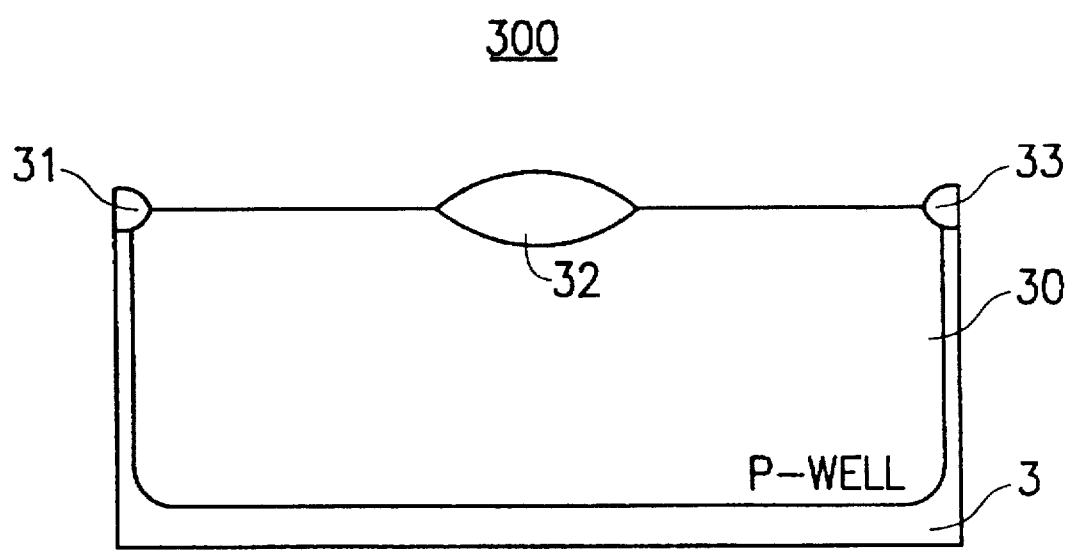

Next, as shown in FIG. 3B, field oxides 31,32,33 are formed on the surface of the substrate 3. Note that the field oxide 32 is formed within the range of the well region 30. The field oxides 31 and 33 are utilized to define an active region 300 therebetween, and serve as isolating structures with other adjacent devices. Preferably, the field oxides 31,32,33 are formed by a local oxidation of silicon (LOCOS) procedure.

Figure 3C:
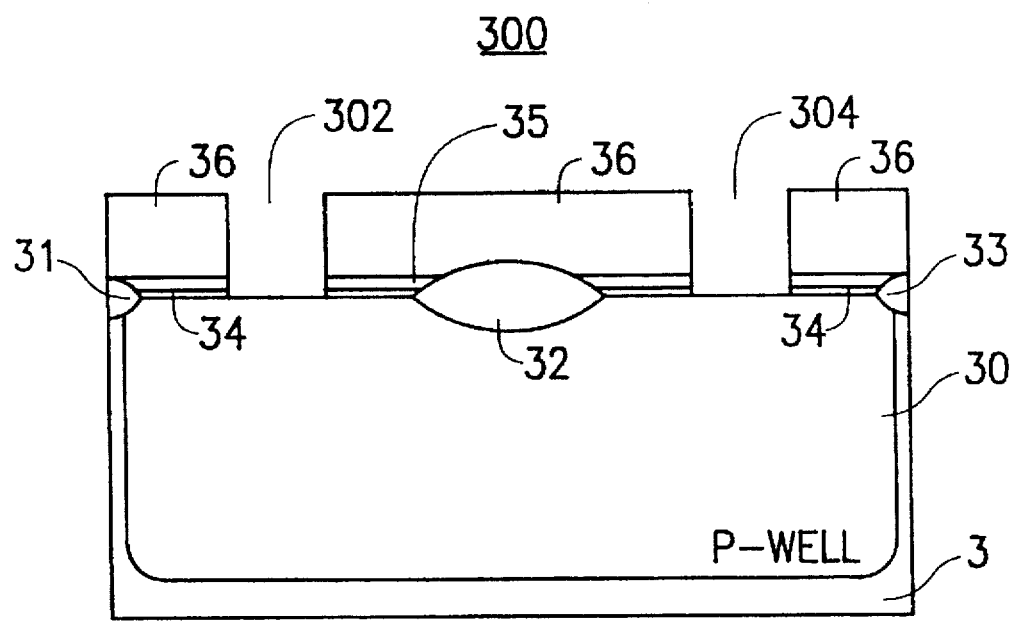

Referring to FIG. 3C, the surface of the well region 30 is then subjected to a thermal oxidation process to form a thin oxide layer 34 overlying the portion not covered by the field oxides 31,32,33. Subsequently, a thin polysilicon layer 35 is formed on the thin oxide layer 34, preferably, in a chemical vapor deposition (CVD) chamber. Then, a first photoresist layer 36 is thereafter coated on the overall surface and patterned to form two openings 302 and 304. By utilizing the first photoresist layer 36 as a mask, the thin polysilicon layer 35 and thin oxide layer 34 is subsequently patterned and etched through those openings 302 and 304 to expose the well region 30 as depicted in FIG. 3C. The thin polysilicon layer 35 and thin oxide layer 34 are compatible with the processes conducted to the internal circuit. However, since the thin layers 34 and 35 are merely used as a diffusion barrier in this embodiment, those materials which can serve as the diffusion barrier, such as silicon nitride or the like, might be used instead.

Figure 3D:
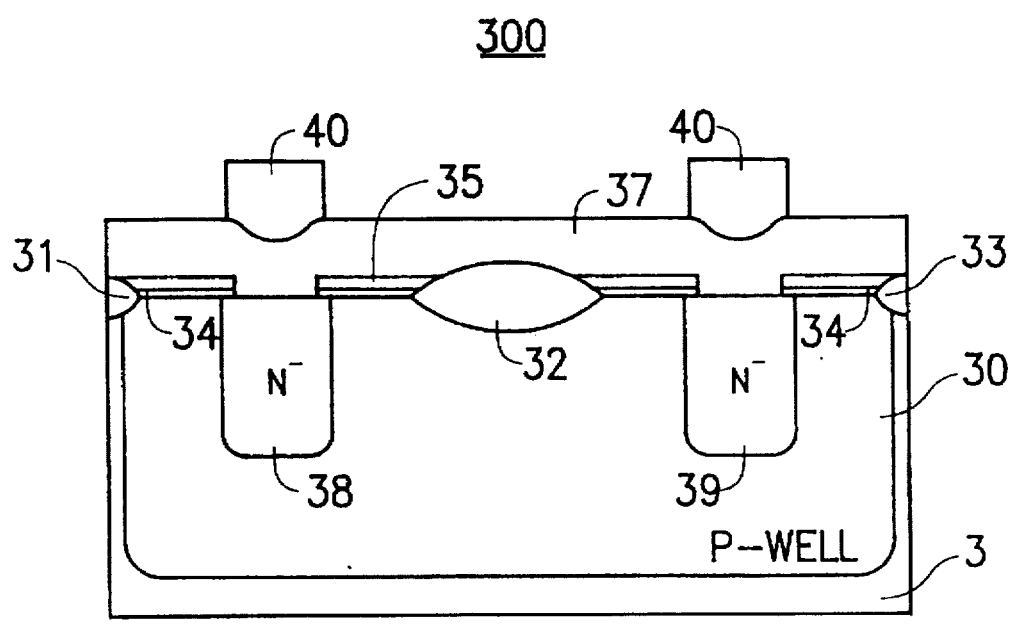

The first photoresist layer 36 is thereafter removed. Referring to FIG. 3D, an n-type polysilicon layer 37 is formed on the overall surface as well as connected to the well region 30 via the openings 302 and 304. The polysilicon layer 37 is heavily-doped with impurities, such as phosphorus-containing ions. After that, thermal diffusion is conducted to drive those impurities contained in the polysilicon layer 37 into the well region 30 through the openings 302 and 304 to form a pair of lightly-doped regions 38 and 39, respectively. As depicted in FIG. 3D, each of the lightly-doped regions 38 and 39 has a junction depth of about 0.5–0.7 μm and a doping concentration of about $5 \times 10^{17} - 5 \times 10^{18}$ cm$^{-3}$.

Figure 3E:
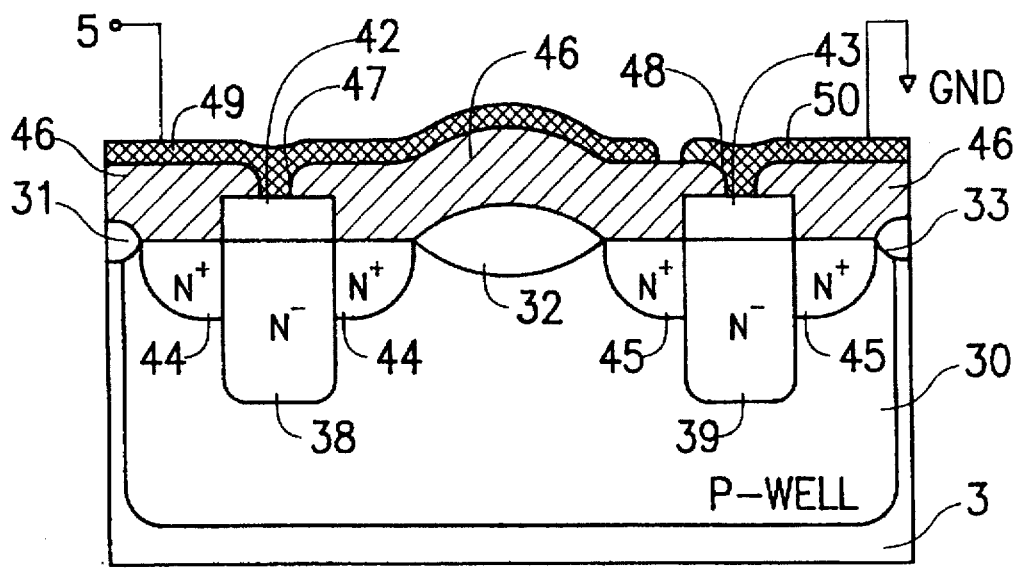

Moreover, a second photoresist layer 40 is coated on the polysilicon layer 37, and then patterned to cover the lightly-doped 38 and 39. Referring to FIG. 3E, with the second photoresist layer 40 used as masking, the polysilicon layer 37 is then patterned and etched to form a pair of conducting blocks 42 and 43 on two lightly-doped regions 38 and 39, respectively. Also, the thin polysilicon layer 35 and thin oxide layer 34 are simultaneously removed from the surface to expose the well region 30. By using the conducting blocks 42,43 and field oxide 32 as masking, n-type impurities are implanted into the well region 30 to form a pair of heavily-doped region 44 and 45, each of which has a junction depth of about 0.1–0.3 μm and a doping concentration of about $5 \times 10^{17} - 5 \times 10^{18}$ cm$^{-3}$, as illustrated in FIG. 3E. The heavily-doped region 44 and lightly-doped region 38 constitute a drain region of the ESD protection device, and the heavily-doped region 45 and lightly-doped region 39 constitute a source region of the ESD protection device.

Figure 1:
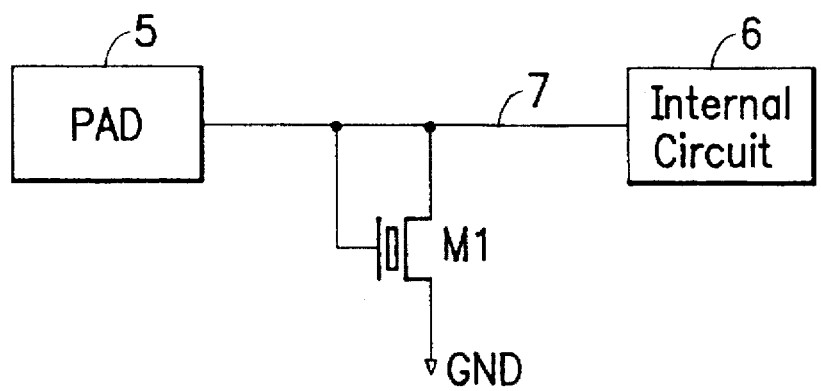
FIG. 1 depicts a circuit diagram having a thick field oxide transistor as an ESD protection device.
Figure 2:
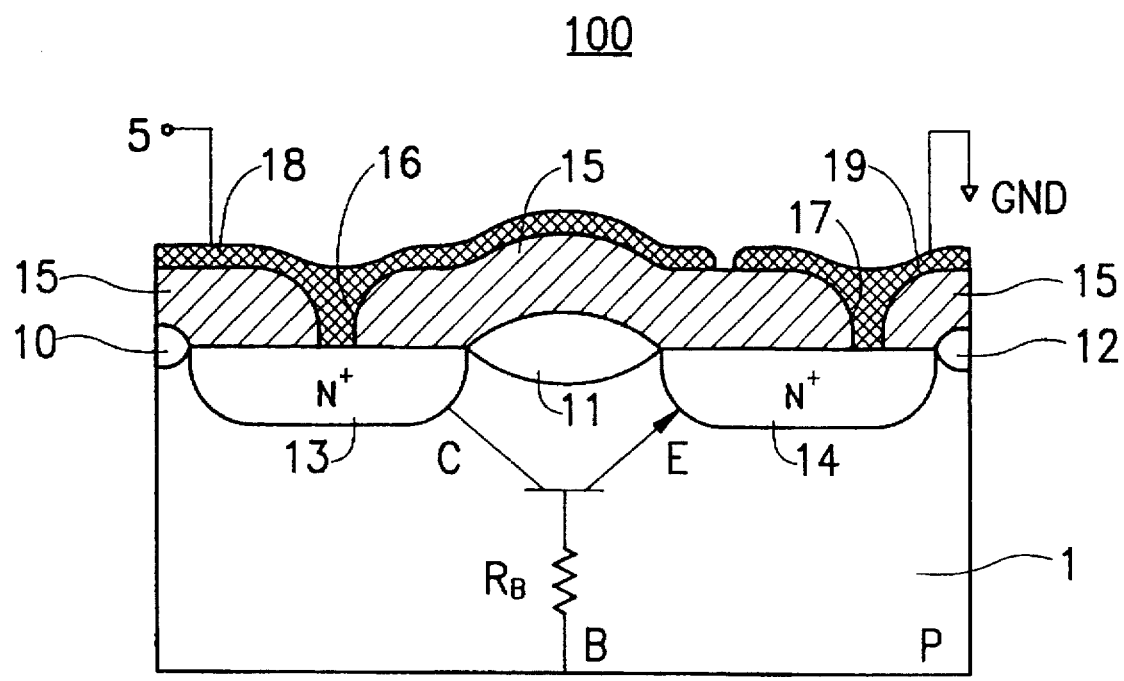
FIG. 2 (PRIOR ART) depicts the cross-sectional view of a conventional thick field oxide transistor formed in a semiconductor substrate.

A dielectric layer 46 is thereafter deposited to overlie the overall surface. The dielectric layer 46 is patterned and etched to form pair of contact windows 47 and 48 to expose the conducting blocks 42 and 43, respectively. A metal layer, such as one made of aluminum, is formed on the dielectric layer 46 and connected to the conducting blocks 42 and 43 via the contact windows 44 and 45, respectively. Afterwards, the metal layer is patterned and etched to form a first electrode 49 and a second electrode 50. The first electrode 49 is connected to the first conducting block 42 via the first contact window 47 as well as to the pad 5 (FIG. 1). In this embodiment, note that the first electrode 49 strides across the field oxide 32. The second electrode 50 is connected to the second conducting block 43 via the second contact window 48 as well as to ground. FIG. 3E illustrates the structure of the preferred embodiment according to the present invention in cross-sectional view.

Figure 4:
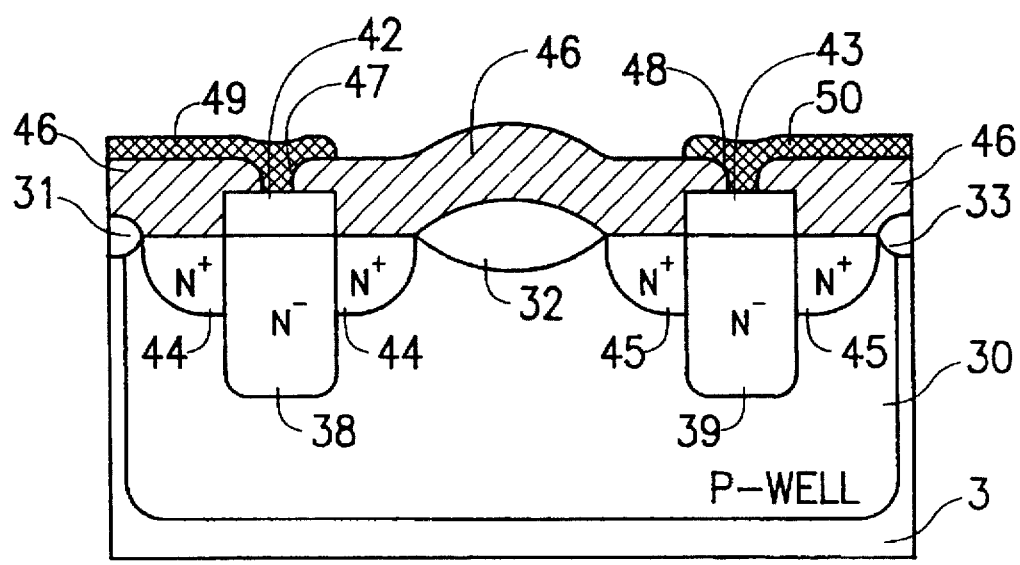
FIG. 4 depicts the cross-sectional view of another preferred embodiment in accordance with the present invention.

FIG. 4 depicts the cross-sectional view of another preferred embodiment. As compared with FIG. 3E, note that the first electrode 49 doesn't stride across the field oxide 32. However, the structure illustrated in FIG. 4 has the capability to protect the internal circuit from ESD stress.

In conclusion, each of the drain region and source region in accordance with the present invention, is constituted by a heavily-doped region and a lightly-doped region, wherein the junction depth of the lightly-doped region is deeper than that of the heavily doped region. Accordingly, the ESD current density will be decreased owing to the enlarged junction area during the ESD event. In addition, the heat dissipation can be spread over the enlarged junction area instead of being focused on the cylindrical portion. In addition, low parasitic capacitance in the bond pad is achieved since the junction capacitance of the lightly-doped region is smaller than that of the heavily-doped region. Furthermore, there are conducting blocks arranged between the lightly-doped regions and the source/drain electrodes, respectively, to prevent the metal melt filament from spiking the junction.

What is claimed is:

1. An electrostatic discharge device, comprising:
   a semiconductor substrate;
   an isolating structure formed on said substrate;
   a drain region and a source region formed in said substrate beneath opposite sides of said isolating structure, each of which is composed of a heavily-doped region and a lightly-doped region wherein said lightly-doped region has a junction depth greater than said heavily-doped region;
   a first conducting block formed above and physically connecting directly to the lightly-doped region in said drain region;
   a second conducting block formed above and physically connecting directly to the lightly-doped region in said source region;
   a dielectric layer covering said isolating structure, source region, and drain region, first conducting block, and second conducting block, having a first contact window and a second contact window therethrough to expose said first conducting block and second conducting block, respectively;
   a first electrode formed on said dielectric layer and coupled to said first conducting block via said first contact window; and
   a second electrode formed on said dielectric layer and coupled to said second conducting block via said second contact window.

2. The device as claimed in claim 1, wherein said isolating structure is a field oxide formed by a process of local oxidation of silicon (LOCOS).

3. The device as claimed in claim 1, wherein each said lightly-doped region has a junction depth in a range between about 0.5 µm–0.7 µm, and a doping concentration in a range between about $5 \times 10^{17}$ cm$^{-3}$–$5 \times 10^{18}$ cm$^{-3}$.

4. The device as claimed in claim 3, wherein each said heavily-doped region has a junction depth in a range between about 0.1 µm–0.3 µm, and a doping concentration in a range between about $5 \times 10^{19}$ cm$^{-3}$–$5 \times 10^{20}$ cm$^{-3}$.

5. The device as claimed in claim 1, wherein said first electrode strides across said isolating structure.

6. The device as claimed in claim 1, wherein said first electrode is connected to a bond pad.

7. The device as claimed in claim 1, wherein said second electrode is connected to the ground.

8. A method for fabricating an electrostatic discharge protection device, comprising:
   providing a semiconductor substrate;
   forming a field oxide layer on said substrate;
   forming a diffusion barrier on said substrate not covered by said field oxide layer;
   forming two openings through said diffusion barrier on opposite sides of said field oxide layer;
   forming a polysilicon layer on said barrier layer to contact said substrate via said openings, wherein said polysilicon layer is doped with impurities;
   diffusing said impurities, into said substrate to form two lightly-doped regions under said openings, respectively;
   patterning said polysilicon layer to form two conducting blocks on said lightly-doped regions, respectively;
   implanting ions into said substrate not covered by said field oxide layer and said conducting blocks to form heavily-doped regions, which have junction depths less than that of said lightly-doped regions;
   forming a dielectric layer overlying the overall surface of said device;
   forming two contact windows through said dielectric layer, each window exposing one of said conducting blocks; and
   forming two electrodes, each electrode connected to one of said conducting blocks via a respective one of said contact windows.

9. The method as claimed in claim 8, wherein each said lightly-doped region has a junction depth in a range between about 0.5 µm–0.7 µm, and a doping concentration in a range between about $5 \times 10^{17}$ cm$^{-3}$–$5 \times 10^{18}$ cm$^{-3}$.

10. The method as claimed in claim 9, wherein each said heavily-doped region has a junction depth in a range between about 0.1 µm–0.3 µm, and a doping concentration in a range between about $5 \times 10^{19}$ cm$^{-3}$–$5 \times 10^{20}$ cm$^{-3}$.

11. The method as claimed in claim 8, wherein said semiconductor substrate is an N-type silicon substrate.

12. The method as claimed in claim 11, wherein said impurities doped in said polysilicon contain phosphorus.

13. The method as claimed in claim 8, wherein said diffusion barrier comprises a thin oxide layer and a thin polysilicon layer.

14. The method as claimed in claim 8, wherein one of said electrode strides across said field oxide layer.

15. The method as claimed in claim, 14, wherein said one electrode is connected to a bond pad.

16. The method as claimed in claim 15, wherein the other of said electrodes is connected to ground.

\* \* \* \* \*